United States Patent
Koh et al.

(10) Patent No.: US 12,057,299 B2
(45) Date of Patent: Aug. 6, 2024

(54) METHODS FOR SELECTIVE REMOVAL OF CONTACT OXIDES

(71) Applicant: Applied Materials, Inc., Santa Clara, CA (US)

(72) Inventors: Tuck Foong Koh, Singapore (SG); John Leonard Sudijono, Singapore (SG)

(73) Assignee: APPLIED MATERIALS, INC., Santa Clara, CA (US)

( * ) Notice: Subject to any disclaimer, the term of this patent is extended or adjusted under 35 U.S.C. 154(b) by 365 days.

(21) Appl. No.: 17/486,210

(22) Filed: Sep. 27, 2021

(65) Prior Publication Data
US 2023/0100602 A1 Mar. 30, 2023

(51) Int. Cl.
| | |
|---|---|
| H01L 21/3065 | (2006.01) |
| C23C 2/02 | (2006.01) |
| C23C 14/02 | (2006.01) |
| C23C 14/12 | (2006.01) |
| C23C 14/54 | (2006.01) |
| H01J 37/32 | (2006.01) |

(52) U.S. Cl.
CPC ........ *H01J 37/32816* (2013.01); *C23C 2/024* (2022.08); *C23C 14/021* (2013.01); *C23C 14/12* (2013.01); *C23C 14/541* (2013.01); *H01J 37/32082* (2013.01); *H01J 37/32449* (2013.01); *H01J 2237/332* (2013.01); *H01J 2237/334* (2013.01); *H01J 2237/335* (2013.01)

(58) Field of Classification Search
None
See application file for complete search history.

(56) References Cited

U.S. PATENT DOCUMENTS

| | | |
|---|---|---|
| 8,105,660 B2 | 1/2012 | Tudhope et al. |
| 2002/0042179 A1 | 4/2002 | Iyer |
| 2004/0266172 A1 | 12/2004 | Kim |
| 2005/0079717 A1 | 4/2005 | Savas et al. |
| 2005/0181588 A1 * | 8/2005 | Kim .......... H01L 21/02063 257/E21.507 |
| 2008/0174029 A1 | 7/2008 | Shim |

(Continued)

FOREIGN PATENT DOCUMENTS

| | | | |
|---|---|---|---|
| KR | 10-0877095 B1 | 1/2009 | |
| WO | WO-2005055305 A1 * | 6/2005 | ....... H01L 21/02063 |

OTHER PUBLICATIONS

International Search Report for PCT/US2022/044665, dated Jan. 16, 2023.

(Continued)

*Primary Examiner* — Shamim Ahmed
(74) *Attorney, Agent, or Firm* — MOSER TABOA

(57) ABSTRACT

A method for cleaning contacts on a substrate incorporates ion control to selectively remove oxides. The method includes exposing the substrate to ions of an inert gas, supplying a first RF frequency of a first bias power supply to a substrate support, supplying a second RF frequency of a second bias power supply to a substrate support, and adjusting a first power level of the first RF frequency and a second power level of the second RF frequency to selectively remove oxide from at least one contact on the substrate while inhibiting sputtering of polymer material wherein the oxide removal is selective over removal of polymer material surrounding the at least one contact.

20 Claims, 6 Drawing Sheets

(56) References Cited

U.S. PATENT DOCUMENTS

| | | | |
|---|---|---|---|
| 2008/0248656 A1* | 10/2008 | Chen | H01L 21/67069 |
| | | | 438/798 |
| 2012/0013831 A1 | 1/2012 | Parri et al. | |
| 2012/0225558 A1* | 9/2012 | Chang | H01L 21/02063 |
| | | | 257/E21.241 |
| 2016/0379856 A1 | 12/2016 | Tomura et al. | |
| 2020/0105519 A1* | 4/2020 | Lin | H01L 21/285 |

OTHER PUBLICATIONS

Marina Nazarova, Chemical Vapour Deposition (CVD) of Graphene on Transition Metals and Its Protective Properties, School of Physics and Astronomy, A thesis submitted to the University of Manchester for the degree of Doctor of Philosophy in the Faculty of Science and Engineering, 126 pages, 2019.

* cited by examiner

METHODS FOR SELECTIVE REMOVAL OF CONTACT OXIDES

FIELD

Embodiments of the present principles generally relate to semiconductor processing of semiconductor substrates.

BACKGROUND

Polymers have been introduced into the semiconductor processes as a curable dielectric material. Polymer materials can also provide shock resistance to electronic devices such as cell phones to increase the durability. During wafer level packaging processes, contacts are formed in the polymer materials that often oxidate easily and require cleaning to reduce the contact's resistance. However, the inventors have found that during such cleaning processes, the polymer material often gets sputtered back onto the contacts, interfering with the cleaning process.

Accordingly, the inventors have provided improved processes that minimize polymer sputtering during contact cleaning, increasing throughput and decreasing resistance of the contacts.

SUMMARY

Methods and apparatus for enhanced cleaning contacts on a substate are provided herein.

In some embodiments, a method for cleaning contacts on a substrate may comprise exposing the substrate to ions of an inert gas, supplying a first RE frequency of a first bias power supply to a substrate support, wherein the first RE frequency controls ion energy of the ions of the inert gas, supplying a second RE frequency of a second bias power supply to a substrate support wherein the second RE frequency controls ion density of the ions of the inert gas and is a higher frequency than the first RE frequency, and adjusting a first power level of the first RF frequency and a second power level of the second RF frequency to selectively remove oxide from at least one contact on the substrate while inhibiting sputtering of polymer material and re-contamination of the at least one contact with polymer material, wherein oxide removal is selective over removal of polymer material surrounding the at least one contact by altering the first power level of the first RE frequency to increase ion energy and wherein a rate of oxide removal on the at least one contact is increased by altering the second power level of the second RF frequency to increase ion density.

In some embodiments, the method may further include decreasing an inert gas flow rate during oxide removal to increase the ion energy, wherein the inert gas flow rate is greater than zero to approximately 50 sccm, reducing a temperature of the substrate to approximately −20 degrees Celsius to approximately 60 degrees Celsius during oxide removal to further inhibit sputtering of polymer material, wherein the temperature is approximately −20 degrees Celsius, maintaining a process pressure of approximately 0.7 mTorr to approximately 20 mTorr during oxide removal, wherein the first RF frequency is approximately 400 kHz to approximately 15 MHz and the second RF frequency is approximately 40 MHz to approximately 110 MHz, wherein the first RF frequency is approximately 13.56 MHz and the second RF frequency is approximately 60 MHz, wherein a selectivity ratio of removal of oxide to removal of polymer material is at least 2:1, wherein the polymer material is polyimide material or polybenzoxazole material, wherein the contact is aluminum material and oxide is aluminum oxide, wherein the method is performed in a wafer level packaging process, wherein the inert gas is argon, and/or wherein the first power level is greater than zero to approximately 2000 W and the second power level is greater than zero to approximately 2000 W.

In some embodiments, a method for cleaning contacts on a substrate may comprise exposing the substrate to ions from argon gas with a gas flow rate of greater than zero to approximately 50 sccm, wherein decreasing the gas flow rate increases ion energy, supplying a first RF frequency of 13.56 MHz from a first bias power supply to a substrate support, wherein the first RF frequency controls ion energy of the ions of the argon gas, supplying a second RF frequency of 60 MHz from a second bias power supply to a substrate support, wherein the second RF frequency controls ion density of the ions of the argon gas, and adjusting a first power level of the first RF frequency and a second power level of the second RF frequency to selectively remove aluminum oxide from at least one contact of aluminum material on the substrate while inhibiting sputtering of polymer material and re-contamination of the at least one contact with polymer material, wherein aluminum oxide removal is selective over removal of polymer material surrounding the at least one contact by altering the first power level of the first RF frequency to increase ion energy and wherein a rate of oxide removal on the at least one contact is increased by altering the second power level of the second RF frequency to increase ion density.

In some embodiments, the method may further include reducing a temperature of the substrate during oxide removal to further inhibit sputtering of polymer material during oxide removal, wherein the temperature is approximately −20 degrees Celsius, maintaining a process pressure of approximately 0.7 mTorr to approximately 20 mTorr during oxide removal, and/or wherein a selectivity ratio of removal of aluminum oxide to removal of polymer material is at least 2:1.

In some embodiments, a non-transitory, computer readable medium having instructions stored thereon that, when executed, cause a method for cleaning contacts on a substrate, the method may comprise exposing the substrate to ions of an inert gas, supplying a first RF frequency of a first bias power supply to a substrate support wherein the first RF frequency controls ion energy of the ions of the inert gas, supplying a second RF frequency of a second bias power supply to a substrate support, wherein the second RF frequency controls ion density of the ions of the inert gas and is a higher frequency than the first RF frequency, and adjusting a first power level of the first RF frequency and a second power level of the second RF frequency to selectively remove oxide from at least one contact on the substrate while inhibiting sputtering of polymer material and re-contamination of the at least one contact with polymer material, wherein oxide removal is selective over removal of polymer material surrounding the at least one contact by altering the first power level of the first RF frequency to increase ion energy and wherein a rate of oxide removal on the at least one contact is increased by altering the second power level of the second RF frequency to increase ion density.

In some embodiments, the non-transitory, computer readable medium of claim 19, the method may further include reducing a temperature of the substrate during oxide removal to further inhibit sputtering of polymer material wherein the temperature is approximately −20 degrees Celsius to approximately 60 degrees Celsius and maintaining a process pressure of approximately 0.7 mTorr to approximately 20 mTorr during oxide removal.

Other and further embodiments are disclosed below.

BRIEF DESCRIPTION OF THE DRAWINGS

Embodiments of the present principles, briefly summarized above and discussed in greater detail below, can be understood by reference to the illustrative embodiments of the principles depicted in the appended drawings. However, the appended drawings illustrate only typical embodiments of the principles and are thus not to be considered limiting of scope, for the principles may admit to other equally effective embodiments.

Figure 1:
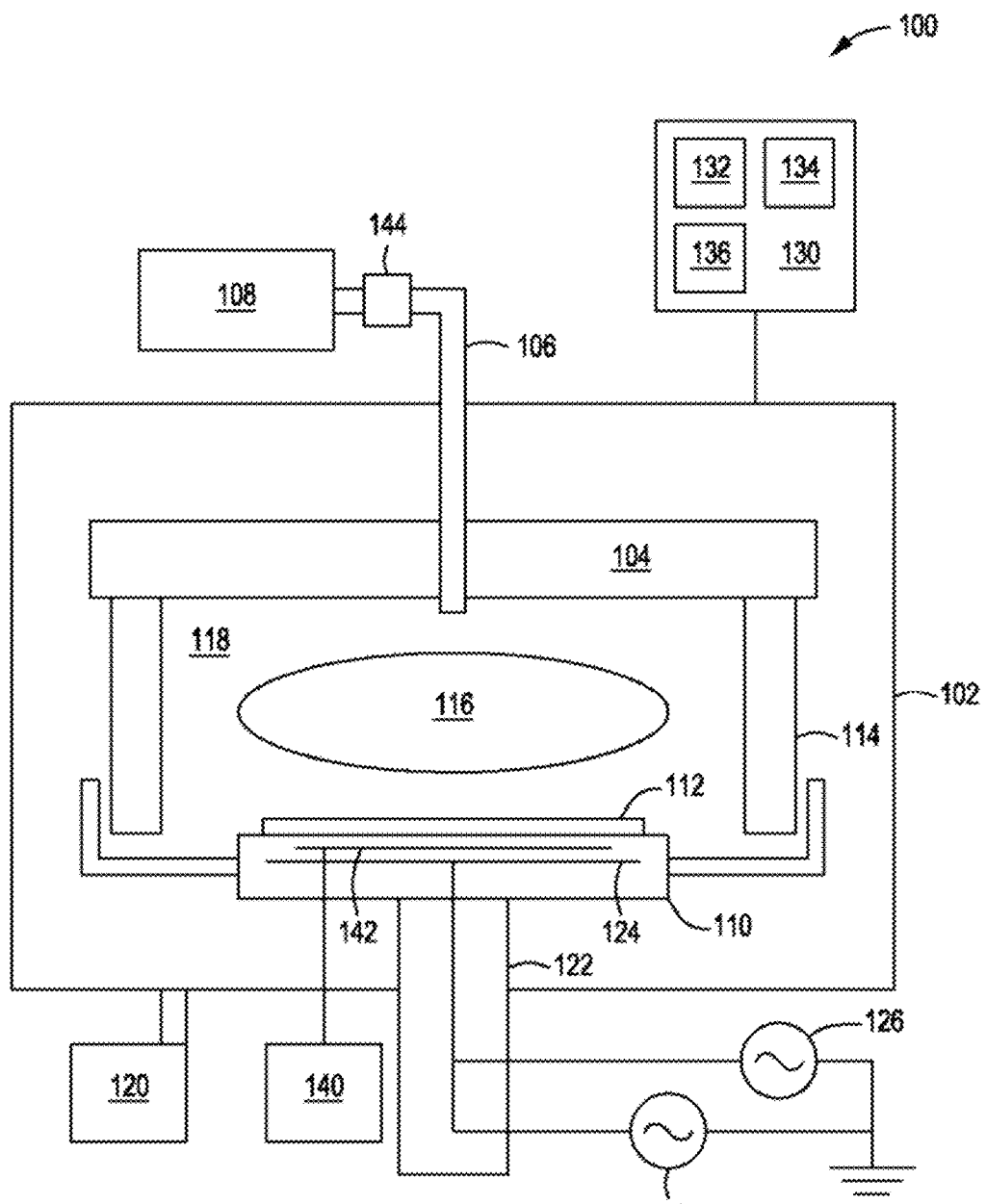
FIG. 1 depicts a cross-sectional view of a process chamber in accordance with some embodiments of the present principles.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

The methods and apparatus enable selective sputter removal of aromatic or main chain fragments in a polymer film using hardware that can supply multiple frequencies to a substrate support that includes an electrostatic chuck (ESC) or substrate holder (without chucking). Such selectivity can be used for sputter etch processes that require less sputtering of large fragments of the polymer that cannot be pumped away or for sputter deposition of polymer films that require main chain fragments of the polymer to be sputtered and then deposited on substrates. For sputter etch, by tuning the plasma to be less selective to the main polymer chains, less large-scale breakdown of the polymer will occur, reducing the outgas of larger polymer fragments that do not get pumped away efficiently. In advanced packaging processes, polymer outgassing needs to be reduced during preclean of metal contacts prior to plasma vapor deposition (PVD) of titanium barrier layers and copper seed layers. For sputter deposition, one can consider the potential of depositing graphene by preferential sputter of acetylene gas ($C_2H_2$).

Sputter etching of materials can be categorized into two main applications: etching a substrate and etching a target material and depositing the target material on a substrate. By using hardware that allows tunability of plasma ion energies and densities (flux), etching selective to different polymer fragments can be achieved, enabling, for example but not limited to, sputter depositing of graphene onto a substrate and the like as well as limiting polymer sputtering to prevent contamination of contacts, etc. In some embodiments, hardware with dual-frequency RF of 13.56 MHz and 60 MHz frequencies and a capacitively coupled plasma (CCP) chamber enable the present methods to be performed. The first frequency of 13.56 MHz is used to provide high ion energy and the second frequency of 60 MHz is used to provide high ion density in the chamber, permitting control of different extents of polymer breakdown and remnant fragments.

FIG. 1 depicts a view 100 of a process chamber 102 in accordance with some embodiments. The process chamber 102 includes a substrate support 122 that includes, for example, an electrostatic chuck (ESC) 110 or non-chucking substrate holder (not shown) and a shield 114 that surrounds a processing volume 118. A showerhead 104 provides a process gas or gases to the processing volume 118 via supply conduit 106 from a gas supply 108. The process gas flow rate is controlled by a gas flow valve 144. In some embodiments, the process gas may be supplied at a flow rate of greater than zero to approximately 50 sccm. The process chamber 102 is a capacitively coupled plasma chamber that forms plasma 116 in the processing volume 118 to process a substrate 112 on the ESC 110. Ions produced from the process gas by plasma reactions are influenced by a first bias power supply 126 and a second bias power supply 128 that are electrically connected to one or more electrodes 124 in the ESC 110. In some embodiments, the first bias power supply 126 produces RF power at a first frequency of approximately 400 kHz to approximately 15 MHz. In some embodiments, the first bias power supply 126 produces RF power at a first frequency of approximately 13.56 MHz. The first frequency allows tuning of the ion energy of the ions produced from the plasma and the process gas based on a first level of power produced by the first bias power supply 126. In some embodiments, the first power level may be greater than zero to approximately 2000 W.

In some embodiments, the second bias power supply 128 produces RF power at a second frequency of approximately 40 MHz to approximately 110 MHz. In some embodiments, the second bias power supply 128 produces RF power at a second frequency of approximately 60 MHz. The second frequency allows tuning of the ion density of the ions produced from the plasma and the process gas based on a second level of power produced by the second bias power supply 128. In some embodiments, the second power level may be greater than zero to approximately 2000 W. As the plasma and ions interact with the substrate 112, contaminants may be formed which are removed from the process chamber 102 by a pump 120. The pump 120 may also be used to maintain the process pressure within the process chamber 102. In some embodiments, the process pressure may be from approximately 0.7 mTorr to approximately 20 mTorr. The process chamber 102 may also have cooling and/or heating elements or channels 142 that allow temperature control of the substrate 112 during processing by a temperature controller 140. In some embodiments, the process temperature may be approximately −20 degrees Celsius to approximately 60 degrees Celsius. In some embodiments, the process temperature may be approximately −20 degrees Celsius. The process chamber 102 may be plasma chamber that is part of a wafer level packaging process flow described below for FIG. 9.

A controller 130 controls the operation of the process chamber 102 using a direct control of the process chamber 102 or alternatively, by controlling the computers (or controllers) associated with the process chamber 102. In operation, the controller 130 enables data collection and feedback from the respective systems to optimize performance of the process chamber 102. The controller 130 generally includes a Central Processing Unit (CPU) 132, a memory 134, and a support circuit 136. The CPU 132 may be any form of a general-purpose computer processor that can be used in an industrial setting. The support circuit 136 is conventionally coupled to the CPU 132 and may comprise a cache, clock circuits, input/output subsystems, power supplies, and the like. Software routines, such as a method as described herein may be stored in the memory 134 and, when executed by the CPU 132, transform the CPU 132 into a specific purpose computer (controller 130). The software routines may also be stored and/or executed by a second controller (not shown) that is located remotely from the process chamber 102.

The memory 134 is in the form of computer-readable storage media that contains instructions, when executed by the CPU 132, to facilitate the operation of the semiconductor processes and equipment. The instructions in the memory 134 are in the form of a program product such as a program that implements the method of the present principles. The program code may conform to any one of a number of different programming languages. In one example, the disclosure may be implemented as a program product stored on a computer-readable storage media for use with a computer system. The program(s) of the program product define functions of the aspects (including the methods described herein). Illustrative computer-readable storage media include, but are not limited to: non-writable storage media (e.g., read-only memory devices within a computer such as CD-ROM disks readable by a CD-ROM drive, flash memory, ROM chips, or any type of solid-state non-volatile semiconductor memory) on which information is permanently stored; and writable storage media (e.g., floppy disks within a diskette drive or hard-disk drive or any type of solid-state random access semiconductor memory) on which alterable information is stored. Such computer-readable storage media, when carrying computer-readable instructions that direct the functions of the methods described herein, are aspects of the present principles.

Figure 2:
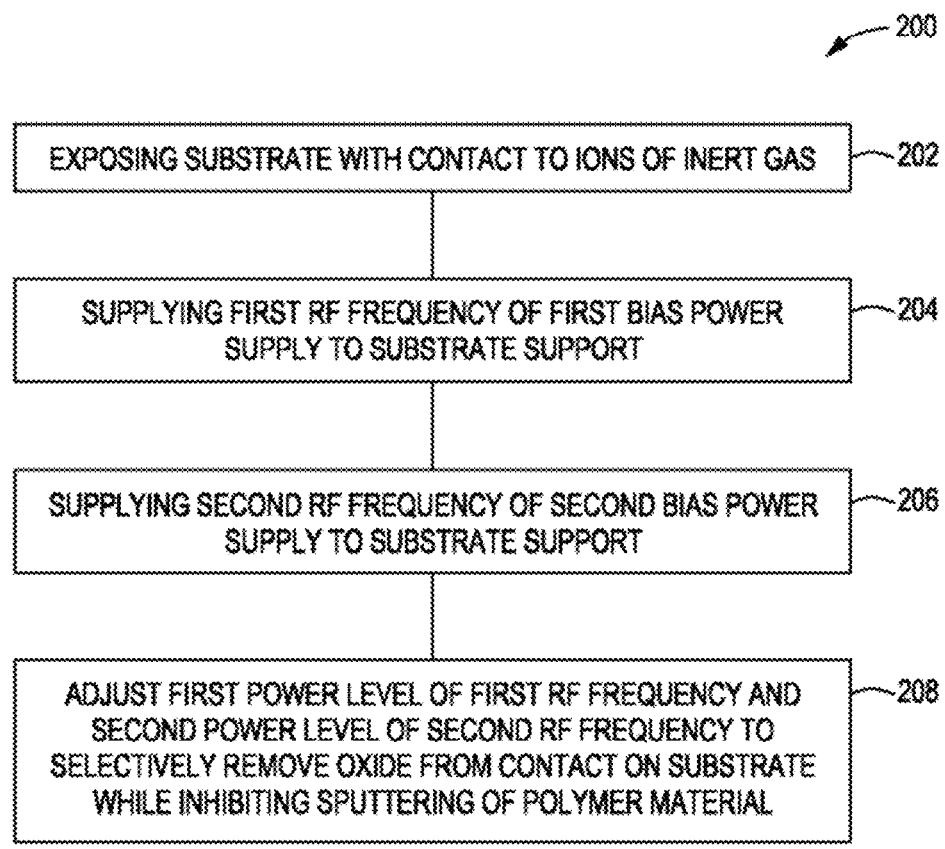
FIG. 2 is a method of cleaning contacts on a substrate in accordance with some embodiments of the present principles.
Figure 10:
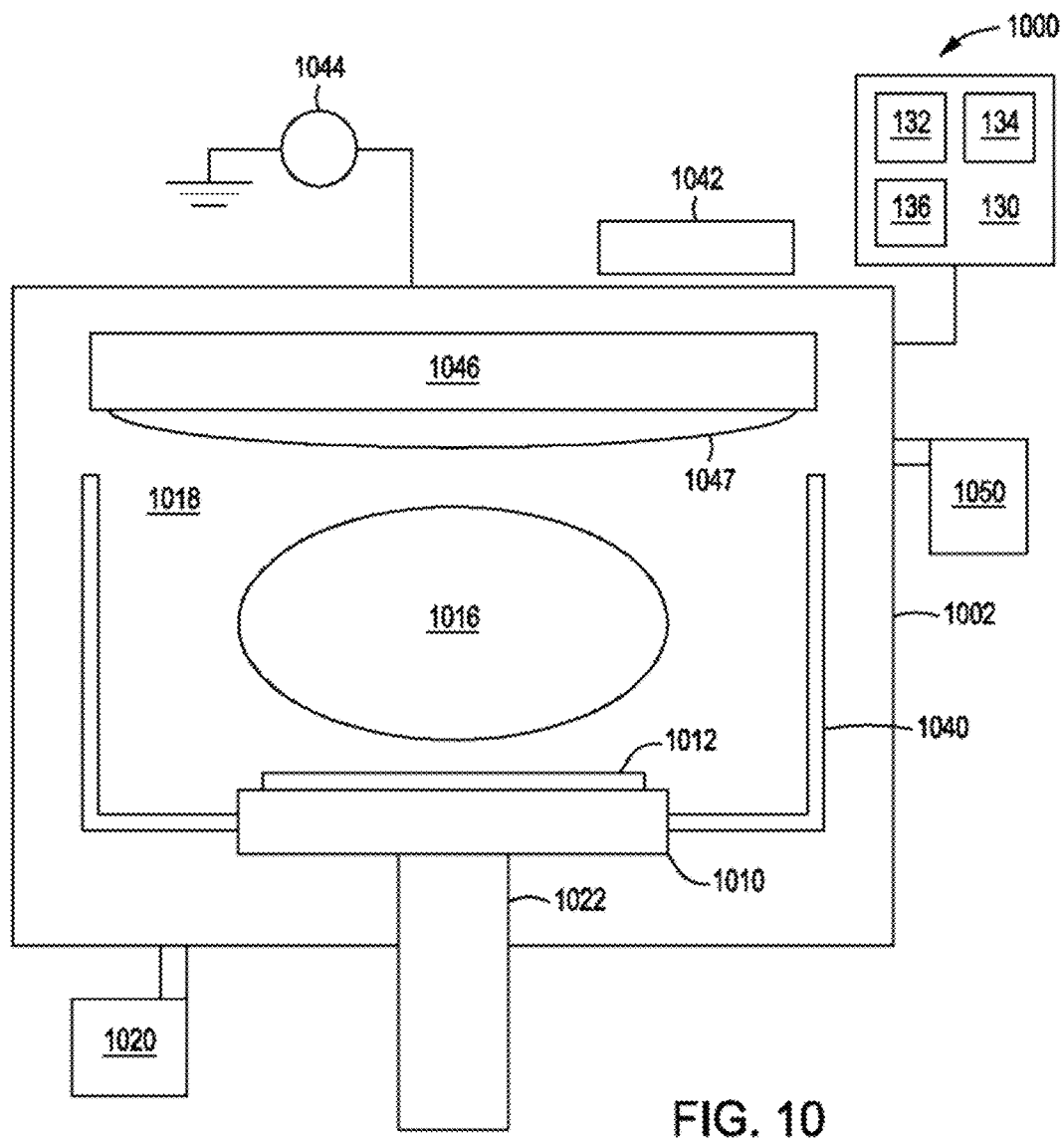
FIG. 10 depicts a cross-sectional view of a process chamber in accordance with some embodiments of the present principles.
Figure 11:
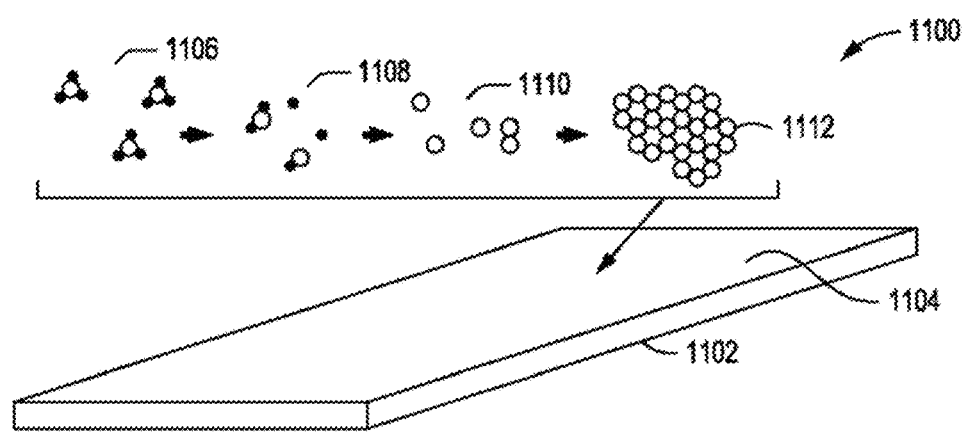
FIG. 11 depicts an isometric view of graphene formation on a copper surface in accordance with some embodiments of the present principles.

The present principles disclosed herein may be used for sputter etching of substrates with polymer materials or sputter etching polymer materials as a target material (see, e.g., FIGS. 10 and 11). The following example is an application of controlling sputter etching of polymer materials on a substrate in order to selectively clean metal contacts on the substrate and is not meant to be limiting as to application of the present principles. The polymer material may be, but is not limited to, polymer materials such as polyimide (PI) and polybenzoxazole (PBO) and the like. FIG. 2 is a method 200 of cleaning contacts on a substrate in accordance with some embodiments. In block 202, the substrate with the contacts is exposed to ions of an inert gas formed by a process gas reacting in plasma in a process chamber such as, for example, a CCP pre-clean chamber as described above in FIG. 1. The process gas may be, but is not limited to, argon gas and the like. The flow rate of the process gas can be used to facilitate tuning the ion energy. In some embodiments, the flow rate may be from greater than zero to approximately 50 sccm. In some embodiments, the flow rate may be approximately 25 sccm. The inventors have found that lower flow rates enhance the selectivity of oxide removal over polymer material removal and subsequently help in decreasing contact resistance, Rc, of the contact. The inventors have also found that reducing the process temperature retards sputtering of polymer material and enhances the selectivity of oxide removal over polymer material removal. In some embodiments, the process temperature may be from approximately −20 degrees Celsius to approximately 60 degrees Celsius. In some embodiments, the process temperature may be approximately −20 degrees Celsius. Similarly, the process pressure may be adjusted to further promote selectivity of the oxide over the polymer material by maintaining a pressure of approximately 0.7 mTorr to approximately 20 mTorr.

In block 204, the first bias power supply provides power to the substrate support at the first RF frequency, in some embodiments, the first RF frequency may be from approximately 400 kHz to approximately 15 MHz. In some embodiments, the first RF frequency may be approximately 13.56 MHz. The inventors have found that lower RF frequencies have a greater influence on ion energy than higher frequencies. By adjusting the power level of the first RE frequency, the ion energy of the ions produced from the process gas can be adjusted to improve the selectivity of oxide over polymer material. Higher levels of power of the first RF frequency give higher levels of ion energy. In some embodiments, the power level of the first RF frequency may be from greater than zero to approximately 2000 W. The inventors have found that high levels of ion energy drive the ions deeper into the polymer material, causing less sputtering of the heavier main chains of polymer material (see, e.g., FIG. 4) which cause carbon bonding with oxygen of the oxides and are more difficult to remove from the contacts and process chamber, increasing the oxide selectivity.

In block 206, the second bias power supply provides power to the substrate support at the second RF frequency. In some embodiments, the second RF frequency may be from approximately 40 MHz to approximately 110 MHz. In some embodiments, the second RF frequency may be approximately 60 MHz. The inventors have found that higher RF frequencies have a greater influence on ion density than lower frequencies. By adjusting the power level of the second RF frequency, the ion density of the ions produced from the process gas can be adjusted to improve the removal rate of the oxide, increasing throughput. Higher levels of power of the second RF frequency give higher levels of ion density and higher oxide removal rates. In some embodiments, the power level of the second RF frequency may be from greater than zero to approximately 2000 W. The inventors have found that high levels of ion density, combined with high levels of ion energy, increase the oxide selectivity over polymer material during cleaning processes. In other words, more high energy ions strike the contact surfaces, increasing the cleaning rate of the oxide from the contacts with less polymer sputtering.

In block 208, the first power level of the first RF frequency and the second power level of the second RF frequency are adjusted to selectively remove oxide from the contacts on the substrate while inhibiting sputtering of polymer material from the surface of the substrate. The oxide removal is selective over removal of polymer material surrounding the contact by altering the first power level of the first RF frequency to increase ion energy and altering a second power level of the second RF frequency to increase ion density. In some embodiments, the first power level may be greater than zero to approximately 2000 W and the second power level may be greater than zero to approximately 2000 W with a flow rate of the process gas from greater than zero to approximately 50 sccm, a process temperature of approximately −20 degrees Celsius to approximately 60 degrees Celsius, and a process pressure of approximately 0.7 mTorr to approximately 20 mTorr. In some embodiments, the first power level may be approximately 800 W and the second power level may be approximately 800 W with a flow rate of the process gas from approximately 20 sccm to approximately 25 sccm, a process temperature of approximately −20 degrees Celsius, and a process pressure of approximately 0.7 mTorr to approximately 20 mTorr. In some embodiments, the oxide to polymer material selectivity may have a ratio of approximately 2:1 or greater. In some embodiments, the contacts are formed from an aluminum-based material and the oxide is aluminum oxide.

Figure 3:
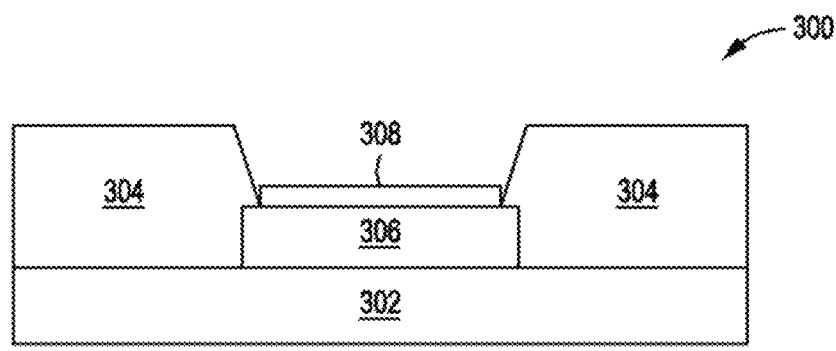
FIG. 3 depicts a cross-sectional view of a contact on a substrate in accordance with some embodiments of the present principles.

FIG. 3 depicts a view 300 of a contact 306 on a substrate 302 in accordance with some embodiments. In some embodiments, the contact is made of a material such as, but not limited to, aluminum and the like. The contact 306 is surrounded by polymer material 304. When exposed to the environment, the contact 306 will begin to oxidize and form an oxide layer 308. As part of a pre-cleaning process, the oxide needs to be removed to allow for deposition of a barrier layer and the like on the contact. If left on the contact, the oxide will dramatically increase the contact resistance, Rc, of the contact. To make the Rc negligible, most of the oxide layer 308 needs to be removed from the contact 306. The inventors found that during the pre-cleaning process carbon from the main polymer chains of the surrounding polymer material was being re-sputtered back onto and bonding with the oxygen of the oxide layer 308, making the cleaning process less effective as the carbon bonds have to be broken first before the oxygen bonds of the oxide can be broken.

Figure 4:
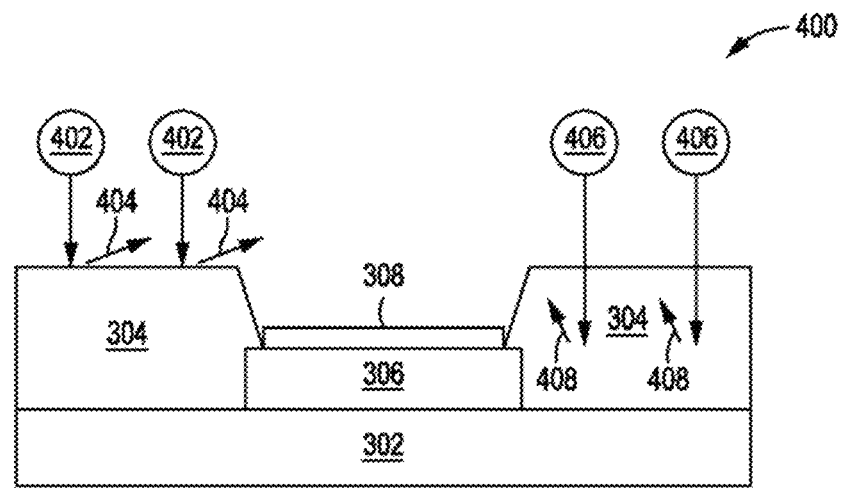
FIG. 4 depicts a cross-sectional view of ions with different energies impacting a substrate in accordance with some embodiments of the present principles.

FIG. 4 depicts a view 400 of ions with different energies impacting a substrate 302 in accordance with some embodiments. Low energy ions 402 from the cleaning plasma reaction were striking the polymer material 304 and sputtering off the main polymer chains 404 of the polymer material 304 and a portion was landing on the oxide layer 308. Any ions that were striking the contact 306 now had to clear off the sputtered polymer material (break carbon bonds) before being able to clean off the oxide layer 308 (break oxygen bonds). Even with increased ion density, the polymer material 304 was being sputtered back onto the oxide layer 308 faster than the ions could clean off the sputtered polymer material, leaving the oxide layer 308 mostly untouched. With the oxide layer 308 still mainly intact, the contact resistance was very high. The inventors found that when high energy ions 406 strike the polymer material 304, the high energy ions 406 penetrate deep into the polymer material 304. Any reactions 408 promoted by the high energy ions 406 were subdued by subsequent absorption of the reaction energy within the polymer material 304. The inventors found that the energy of the subdued reactions was not significant enough to sputter the main polymer chains of the polymer material 304, and, if any sputtering occurred, the sputtered polymer material was mostly composed of smaller polymer side chains of the polymer material 304.

Figure 5:
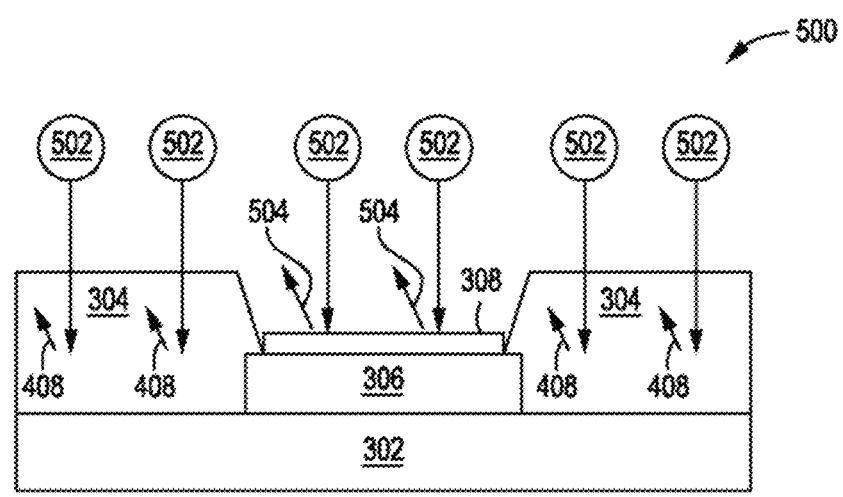
FIG. 5 depicts a cross-sectional view of ions of an inert gas cleaning a contact on a substrate in accordance with some embodiments of the present principles.
Figure 6:
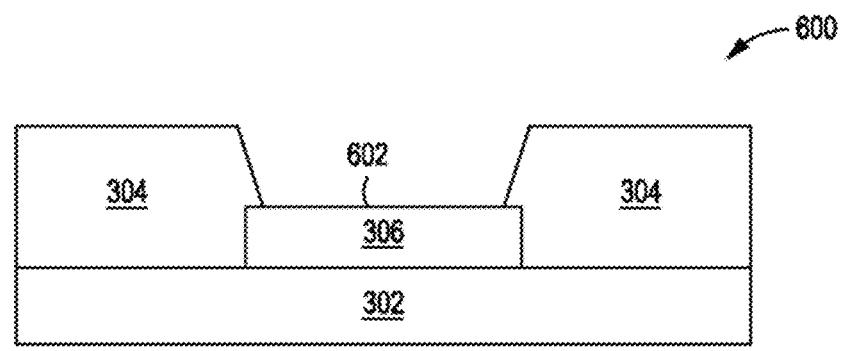
FIG. 6 depicts a cross-sectional view of a cleaned contact oar a substrate in accordance with some embodiments of the present principles.
Figure 7:
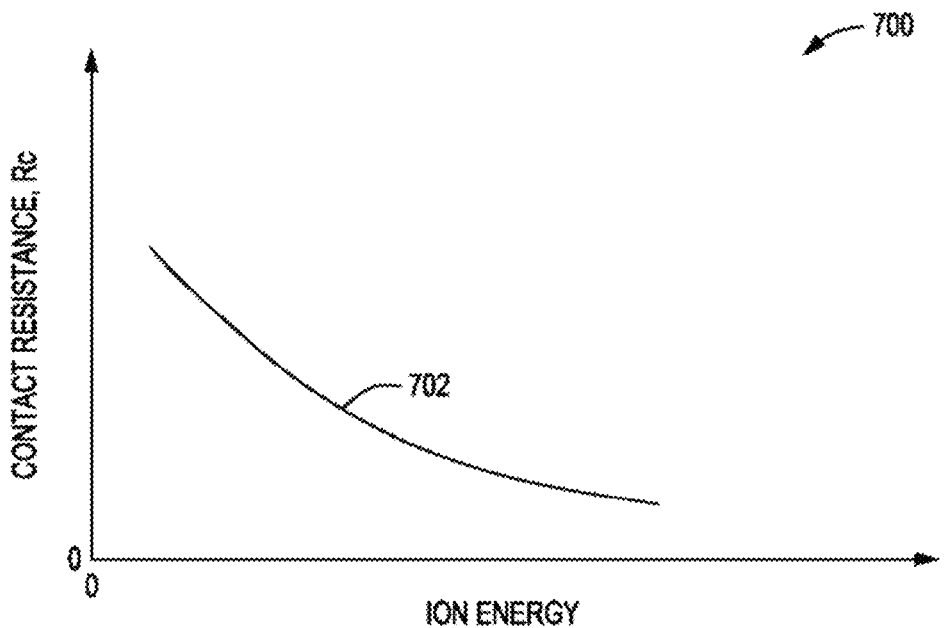
FIG. 7 depicts a graph of contact resistance versus ion energy in accordance with some embodiments of the present principles.
Figure 8:
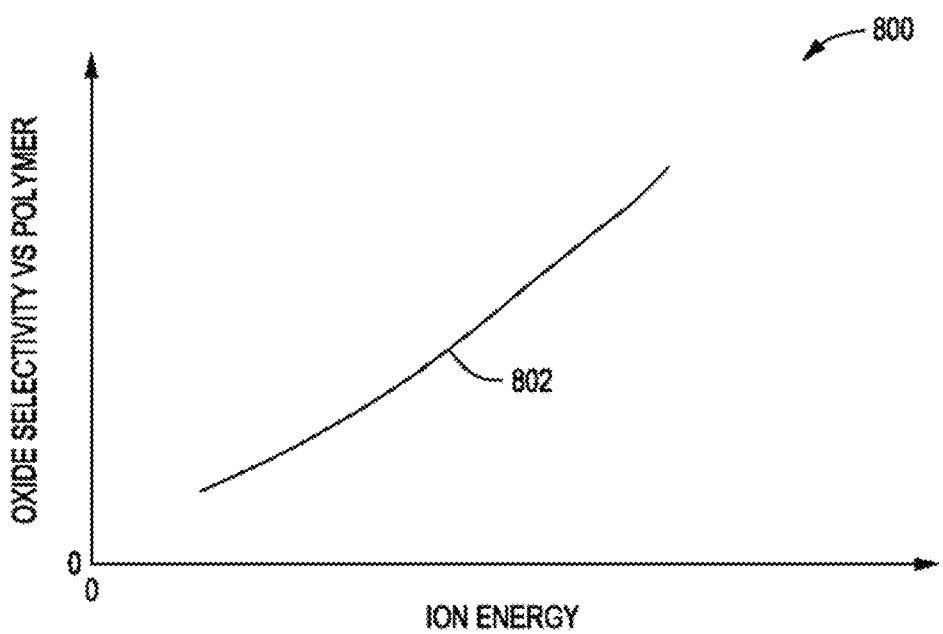
FIG. 8 depicts a graph of oxide selectivity over polymer in accordance with some embodiments of the present principles.

FIG. 5 depicts a view 500 of ions of an inert gas cleaning a contact 306 on a substrate 302 in accordance with some embodiments. The ions 502 are generated with high energy (e.g., high power level of the first RF frequency) and with high density (e.g., high power level of the second RF frequency). The high energy of the ions 502 is mostly absorbed by the polymer material 304 causing high selectivity of the oxide of the oxide layer 308 over the polymer material 304. The high energy of the ions 502 penetrate much less on the contact 306 due to the metallic structures of the contact 306, more effectively cleaning the oxides 504 from the contact 306. FIG. 7 depicts a graph 700 of contact resistance versus ion energy in accordance with some embodiments. The Rc curve 702 is indicative of the reduction of the Rc as ion energies were increased. FIG. 8 depicts a graph 800 of oxide selectivity over polymer in accordance with some embodiments. The selectivity curve 802 is indicative of the increase in selectivity of oxide over polymer material with increased ion energies. With less re-sputtering of the polymer material onto the oxide layer 308, the increased ion density provides a faster removal rate of the oxide and a more thorough clean during the pre-clean process, reducing the contact resistance. FIG. 6 depicts a view 600 of a cleaned upper surface 602 of the contact 306 on the substrate 302 in accordance with some embodiments. Once the oxide is removed from the contact 306, the contact 306 is ready for follow on processing such as barrier layer deposition and the like.

Figure 9:
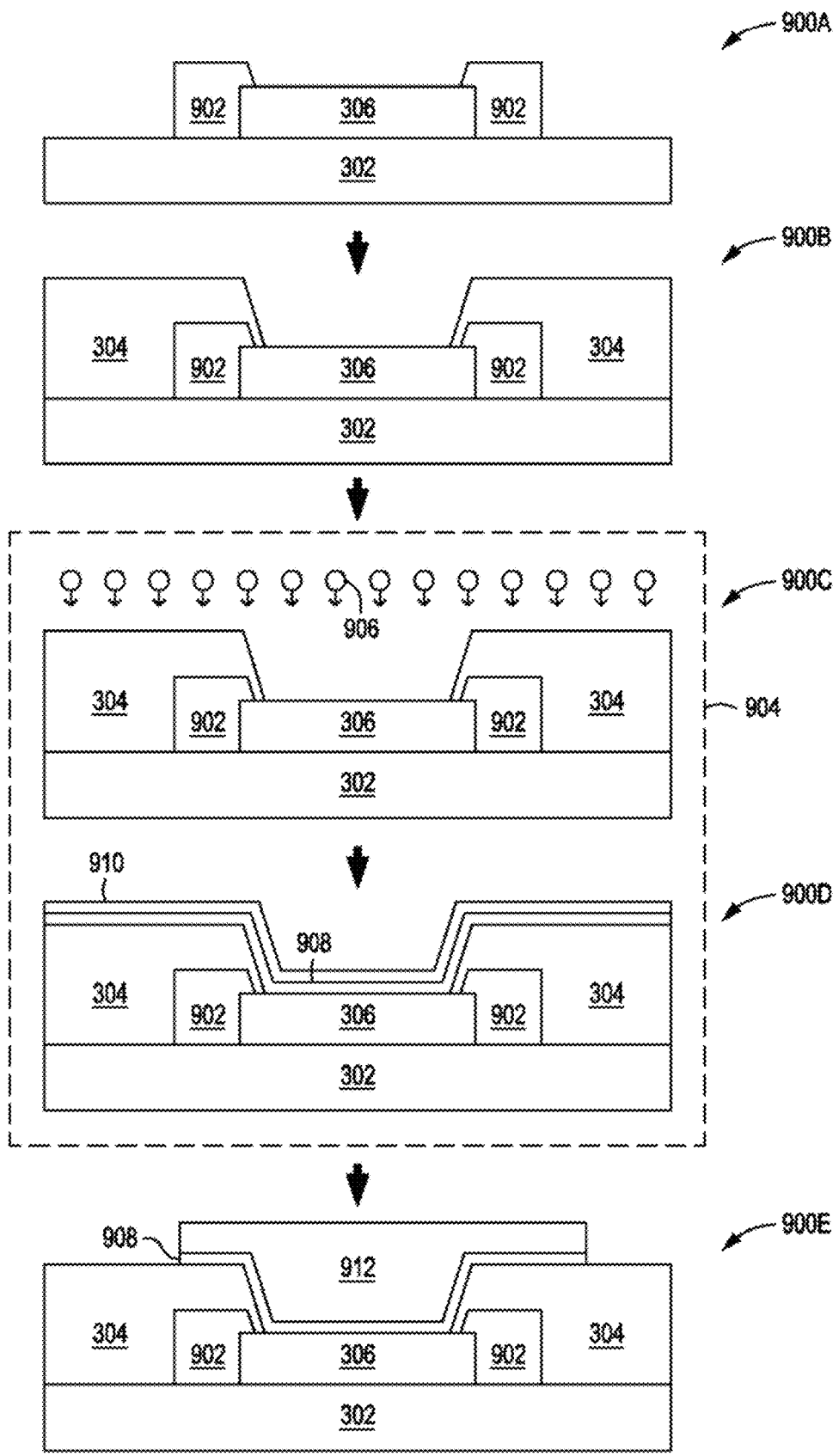
FIG. 9 depicts cross-sectional views of a wafer level packaging process in accordance with some embodiments of the present principles.

The methods of the present principles may be used in packaging processes and other workflows. As an example, FIG. 9 depicts views 900A-900E of a wafer level packaging process in accordance with some embodiments. In view 900A, the contact 306 is formed on the substrate 302 with adjacent nits 902. Polymer material 304 is then deposited on the substrate 302, surrounding the contact 306 in view 900B. The substrate 302 may then enter a chamber(s) 904 for cleaning and deposition of subsequent layers. In view 900C, high energy and high density ions 906 according to the present methods are used to clean the contact 306. In view 900D, a barrier layer 908 and a seed layer 910 are deposited on the contact 306 in the chamber(s) 904. The substrate 302 then leaves the chamber(s) 904 for deposition of bulk material such as an electrochemical plating process followed by patterning and removal of excess material to form an upper contact 912. The present principles easily integrate into existing workflows without requiring the learning of a completely new workflow that accompanies unfamiliar processes or large process changes.

The present principles disclosed herein provide the ability to better control aspects of polymer sputtering. As discussed above for contact cleaning, the main polymer chains of the polymer material were inhibited from sputtering. However, in some circumstances, sputtering of the main polymer chains of the polymer material rather than the smaller side chains may be advantageous. One such application is the formation of graphene on copper by main polymer chain sputtering of polymer materials. FIG. 10 depicts a view 1000 of a process chamber 1002 in accordance with some embodiments. The process chamber 1002 includes a substrate support 1022 that includes, for example, an electrostatic chuck (ESC) 1010 or non-chucking substrate holder (not shown) and a shield 1014 that surrounds a processing volume 1018. A DC power supply 1044 provides power to a backing plate 1046 and/or a polymer material target 1047.

The process chamber 1002 forms plasma 1016 in the processing volume 1018 to process a substrate 1012 on the ESC 1010 and may use a magnetic assembly 1042 to influence sputtering of the polymer material target 1047. A pump 1020 may be used to control the process pressure and to evacuate the chamber of any contamination and gases. A gas supply 1050 may be connected to the process chamber 1002 to provide a process gas during processing of the substrate 1012.

By controlling the sputtering to produce main chain polymer material depositions on the substrate 1012, material such as, but not limited to, graphene may be formed on the substrate 1012. FIG. 11 depicts a view 1100 of graphene formation on a copper surface 1104 of a substrate 1102 in accordance with some embodiments. In some embodiments, acetylene gas ($C_2H_2$) may be used as the process gas in the presence of the polymer material target 1047 to preferentially sputter benzene rings for deposition onto a copper catalyst such as the copper surface 1104. The temperature of the process chamber 1002 may be maintained to promote bonding on the copper surface 1104. The sputtered molecules 1106 will decompose 1108, and through adsorption and dehydrogenation, carbon 1110 is left to surface migrate towards each other and form graphene molecules 1112 on the copper surface 1104. The preferential sputtering of the main polymer chains from a polymer material target may also be used to produce other types of depositions beyond graphene.

Embodiments in accordance with the present principles may be implemented in hardware, firmware, software, or any combination thereof. Embodiments may also be implemented as instructions stored using one or more computer readable media, which may be read and executed by one or more processors. A computer readable medium may include any mechanism for storing or transmitting information in a form readable by a machine (e.g., a computing platform or a "virtual machine" running on one or more computing platforms). For example, a computer readable medium may include any suitable form of volatile or non-volatile memory. In some embodiments, the computer readable media may include a non-transitory computer readable medium.

While the foregoing is directed to embodiments of the present principles, other and further embodiments of the principles may be devised without departing from the basic scope thereof.

The invention claimed is:

1. A method for cleaning contacts on a substrate, comprising:
   exposing the substrate to ions of an inert gas;
   supplying a first RF frequency of a first bias power supply to a substrate support, wherein the first RF frequency controls ion energy of the ions of the inert gas;
   supplying a second RF frequency of a second bias power supply to a substrate support, wherein the second RF frequency controls ion density of the ions of the inert gas and is a higher frequency than the first RF frequency; and
   adjusting a first power level of the first RF frequency and a second power level of the second RF frequency to selectively remove oxide from at least one contact on the substrate while inhibiting sputtering of polymer material and re-contamination of the at least one contact with the polymer material, wherein the oxide removal is selective over removal of the polymer material surrounding the at least one contact by altering the first power level of the first RF frequency to increase ion energy and wherein a rate of oxide removal on the at least one contact is increased by altering the second power level of the second RF frequency to increase ion density.

2. The method of claim 1, further comprising:
   decreasing an inert gas flow rate during oxide removal to increase the ion energy.

3. The method of claim 2, wherein the inert gas flow rate is greater than zero to approximately 50 sccm.

4. The method of claim 1, further comprising:
   reducing a temperature of the substrate to approximately −20 degrees Celsius to approximately 60 degrees Celsius during oxide removal to further inhibit sputtering of polymer material.

5. The method of claim 4, wherein the temperature is approximately −20 degrees Celsius.

6. The method of claim 1, further comprising:
   maintaining a process pressure of approximately 0.7 mTorr to approximately 20 mTorr during oxide removal.

7. The method of claim 1, wherein the first RF frequency is approximately 400 kHz to approximately 15 MHz and the second RF frequency is approximately 40 MHz to approximately 110 MHz.

8. The method of claim 7, wherein the first RF frequency is approximately 13.56 MHz and the second RF frequency is approximately 60 MHz.

9. The method of claim 1, wherein a selectivity ratio of removal of oxide to removal of polymer material is at least 2:1.

10. The method of claim 1, wherein the polymer material is polyimide material or polybenzoxazole material.

11. The method of claim 1, wherein the contact is aluminum material and oxide is aluminum oxide.

12. The method of claim 1, wherein the method is performed in a wafer level packaging process.

13. The method of claim 1, wherein the inert gas is argon.

14. The method of claim 1, wherein the first power level is greater than zero to approximately 2000 W and the second power level is greater than zero to approximately 2000 W.

15. A method for cleaning contacts on a substrate, comprising:
   exposing the substrate to ions from argon gas with a gas flow rate of greater than zero to approximately 50 sccm, wherein decreasing the gas flow rate increases ion energy;
   supplying a first RF frequency of 13.56 MHz from a first bias power supply to a substrate support, wherein the first RF frequency controls ion energy of the ions of the argon gas;
   supplying a second RF frequency of 60 MHz from a second bias power supply to a substrate support, wherein the second RF frequency controls ion density of the ions of the argon gas; and
   adjusting a first power level of the first RF frequency and a second power level of the second RF frequency to selectively remove aluminum oxide from at least one contact of aluminum material on the substrate while inhibiting sputtering of polymer material and re-contamination of the at least one contact with the polymer material, wherein the aluminum oxide removal is selective over removal of the polymer material surrounding the at least one contact by altering the first power level of the first RF frequency to increase ion energy and wherein a rate of oxide removal on the at least one contact is increased by altering the second power level of the second RF frequency to increase ion density.

16. The method of claim 15, further comprising:
reducing a temperature of the substrate during oxide removal to further inhibit sputtering of polymer material during oxide removal, wherein the temperature is approximately −20 degrees Celsius.

17. The method of claim 15, further comprising:
maintaining a process pressure of approximately 0.7 mTorr to approximately 20 mTorr during oxide removal.

18. The method of claim 15, wherein a selectivity ratio of removal of aluminum oxide to removal of polymer material is at least 2:1.

19. A non-transitory, computer readable medium having instructions stored thereon that, when executed, cause a method for cleaning contacts on a substrate, the method comprising:
exposing the substrate to ions of an inert gas;
supplying a first RF frequency of a first bias power supply to a substrate support, wherein the first RF frequency controls ion energy of the ions of the inert gas;
supplying a second RF frequency of a second bias power supply to a substrate support, wherein the second RF frequency controls ion density of the ions of the inert gas and is a higher frequency than the first RF frequency; and
adjusting a first power level of the first RF frequency and a second power level of the second RF frequency to selectively remove oxide from at least one contact on the substrate while inhibiting sputtering of polymer material and re-contamination of the at least one contact with the polymer material, wherein the oxide removal is selective over removal of the polymer material surrounding the at least one contact by altering the first power level of the first RF frequency to increase ion energy and wherein a rate of oxide removal on the at least one contact is increased by altering the second power level of the second RF frequency to increase ion density.

20. The non-transitory, computer readable medium of claim 19, the method further comprising:
reducing a temperature of the substrate during oxide removal to further inhibit sputtering of polymer material, wherein the temperature is approximately −20 degrees Celsius to approximately 60 degrees Celsius; and
maintaining a process pressure of approximately 0.7 mTorr to approximately 20 mTorr during oxide removal.

* * * * *

UNITED STATES PATENT AND TRADEMARK OFFICE
CERTIFICATE OF CORRECTION

| | |
|---|---|
| PATENT NO. | : 12,057,299 B2 |
| APPLICATION NO. | : 17/486210 |
| DATED | : August 6, 2024 |
| INVENTOR(S) | : Tuck Foong Koh et al. |

It is certified that error appears in the above-identified patent and that said Letters Patent is hereby corrected as shown below:

In the Specification

In Column 1, Line 32, delete "RE" and insert -- RF --
In Column 1, Line 33, delete "RE" and insert -- RF --
In Column 1, Line 35, delete "RE" and insert -- RF --
In Column 1, Line 36, delete "RE" and insert -- RF --
In Column 1, Line 38, delete "RE" and insert -- RF --
In Column 1, Line 46, delete "RE" and insert -- RF --
In Column 3, Line 32, delete "oar" and insert -- on --
In Column 6, Line 31, delete "RE" and insert -- RF --

In the Claims

In Column 10, Line 3, Claim 1, delete "RE" and insert -- RF --

Signed and Sealed this
Twenty-second Day of October, 2024

*Katherine Kelly Vidal*

Katherine Kelly Vidal
*Director of the United States Patent and Trademark Office*